United States Patent [19]
Kohno et al.

[11] Patent Number: 5,563,435
[45] Date of Patent: Oct. 8, 1996

[54] INSULATED GATE TYPE SEMICONDUCTOR DEVICE HAVING BUILT-IN PROTECTION CIRCUIT

[75] Inventors: Yasuhiko Kohno; Yoshitaka Sugawara, both of Hitachi, Japan

[73] Assignee: Hitachi, Ltd., Tokyo, Japan

[21] Appl. No.: 405,835

[22] Filed: Mar. 17, 1995

[30] Foreign Application Priority Data

Mar. 17, 1994 [JP] Japan .................................. 6-046761

[51] Int. Cl.$^6$ .......................... H01L 29/76; H01L 29/94; H01L 31/62; H01L 31/113
[52] U.S. Cl. .............................. 257/328; 257/139
[58] Field of Search ...................... 257/328, 355, 257/175, 139

[56] References Cited

U.S. PATENT DOCUMENTS

| | | | |
|---|---|---|---|
| 5,012,213 | 4/1991 | Fujihara | 257/328 |
| 5,045,902 | 9/1991 | Bancal | 257/328 |
| 5,260,590 | 11/1993 | Temple | 257/139 |
| 5,357,120 | 10/1994 | Mori | 257/139 |
| 5,489,789 | 2/1996 | Nakanishi et al. | 257/139 |

FOREIGN PATENT DOCUMENTS

| | | | |
|---|---|---|---|
| 397269 | 4/1991 | Japan | 257/328 |
| 4-361571 | 12/1992 | Japan . | |

*Primary Examiner*—Stephen Meier
*Attorney, Agent, or Firm*—Antonelli, Terry, Stout & Kraus

[57] ABSTRACT

A semiconductor substrate is partitioned into a main IGBT region and a protection circuit region by a p-type well portion which is formed therebetween in contact with an emitter electrode and which acts as a cut-off region. Both a detection IGBT and protection circuit elements are formed within the protection circuit region. Since excessive carriers flowing from the main IGBT into the protection circuit region can efficiently be extracted through the p-type well portion, a highly reliable and high precision protection circuit built-in insulated gate semiconductor device is realized that can precisely detect any overcurrent, and operate without causing malfunction in the protection circuit and time delay.

20 Claims, 15 Drawing Sheets

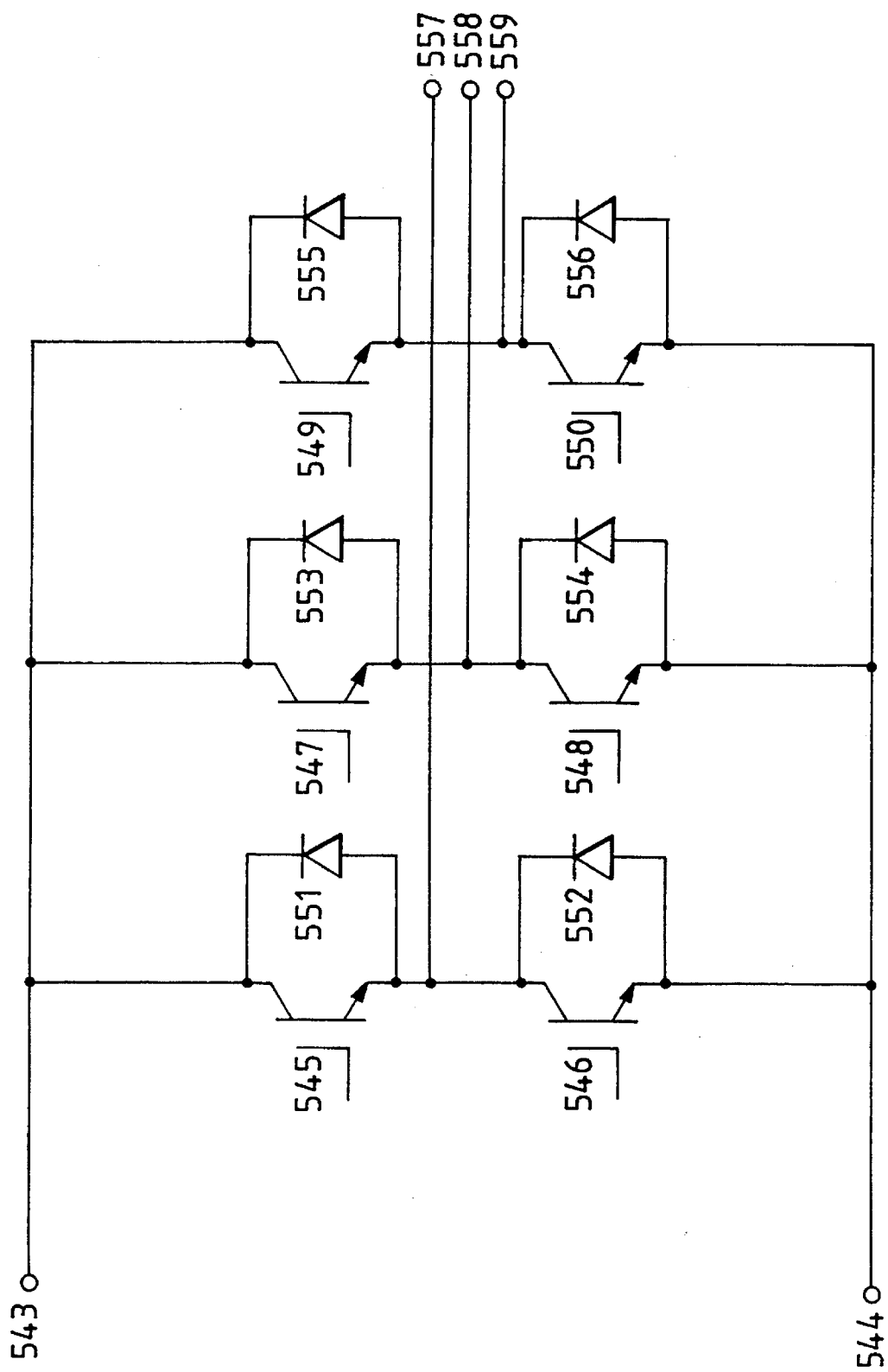

INSULATED GATE TYPE SEMICONDUCTOR DEVICE HAVING BUILT-IN PROTECTION CIRCUIT

BACKGROUND OF THE INVENTION

1. Field of the Invention

This invention relates generally to insulated-gate type semiconductor devices, and more particularly, to an insulated-gate type semiconductor device having a built-in protection circuit.

2. Background Art

Insulated gate bipolar transistors (hereinafter referred to as IGBTs) have been widely used as fast switching elements. IGBTs have been developed as desirable switching elements which have both advantages of a low on-resistance characteristic of bipolar transistors in their ON state and a fast switching capability of insulated gate field effect transistors (hereinafter referred to as MOSFETs).

When any fault occurs in the main circuit of an IGBT during its operation, its elements may break down due to an excessive current or voltage. In such an instance, it becomes necessary to provide for a protection circuit which will start its operation to protect the IGBT before it breaks down. In such a protection circuit, an overcurrent or overvoltage detection element (which will be referred to as detection element) coupled to the IGBT is adapted to detect occurrence of any abnormality, then, the gate voltage of the IGBT is controlled accordingly to protect it from breakdown. This protection circuit of the IGBT is comprised in conjunction with an IGBT, diodes and transistors, resistance, capacitors and the like, and is provided mostly in a module or package.

On the other hand, there is a great demand for reducing the size of power conversion equipment utilizing IGBTs, thus, many attempts have been made, and continue to be made to integrate such protection circuit configurations or mount it on one chip. With respect to the above-mentioned protection circuit, it has been desired to integrate it into the IGBT's internal configuration so as to be provided in a single chip, and such an example has been already disclosed in the Japanese Patent Application Laid-Open No. 4-361571. This detection element built-in IGBT is provided with a carrier drawing or extracting portion which is disposed between a main IGBT region and a detection IGBT region for preventing a current concentration into the detection IGBT, within an area surrounded by this carrier extracting portion (hereinafter referred to as a partitioning portion) the detection IGBT is formed so as to improve linearities of a detection current and the main current.

According to the foregoing detection element built-in IGBT, however, since only the detection IGBT is formed within the partitioning portion, a separate protection circuit is required, further requiring wiring from the detection IGBT to the separate protection circuit outside the partitioned area. Accordingly, due to wiring resistance and wiring inductance thus added, there occurs a time lag from detection of an overcurrent to the operation of the protection circuit, causing a problem that precision and reliability of the protection operation area is lowered. There is another problem that the provision of the partitioning portion results in an increase in the size of a chip.

SUMMARY OF THE INVENTION

Accordingly, it is an object of the present invention to provide an improved insulated gate type semiconductor device having an enhanced reliability and precision of protection operation, and electric power conversion equipment using such a device.

It is another object of the invention to provide an insulated gate semiconductor device that can improve linearlities of the main current and the detection current without providing any partitioning portion, and electric power conversion equipment using such a device.

A first feature of the invention in order to achieve the aforementioned objects of the invention resides in that a semiconductor substrate is partitioned laterally to have a first region and a second region, wherein in the first region an insulated gate element is formed for flowing the main current, and in the second region are formed an insulated gate element for detecting an abnormal current and a protection circuit, and further between the first region and the second region there is provided a partitioning portion.

A second feature of the invention resides in that a semiconductor substrate is partitioned laterally to have a first region and a second region, wherein in the first region is formed an insulated gate element for flowing the main current, and in the second region are formed an insulated gate element for detecting an abnormal current and a protection circuit, and wherein such a semiconductor element included in the protection circuit and whose base layer is formed in the semiconductor substrate is disposed between the first region and the insulated gate element for detecting the current, with its base layer being connected either to a source electrode or an emitter electrode.

According to the first feature of the invention, since the partitioning portion is provided between the first region and a current detecting insulated gate and protection circuit, excessive carriers are caused to be drawn or extracted through this partitioning portion. Thereby, a current concentration into the current detecting insulated gate element can be prevented so that not only the linearlities of the main current and the detected current can be ensured, but also an excessive carrier inflow can be prevented from flowing into the region where semiconductor elements of the protection circuit are formed. Thereby, the precision of current detection has been improved significantly, and also malfunctioning of the protection circuit has been eliminated. In addition, since the protection circuit and the current detecting insulated gate element can be disposed in close proximity to one another, which advantageously reduces the length of wiring therebetween, a time lag between the detection of an overcurrent and the starting of operation of the protection circuit, which has been the problem associated with the prior art, has been minimized.

Further, according to the second feature of the invention, since the base layer of the semiconductor element of the protection circuit is adapted to function as the partitioning portion, the linearlities of the main current and the detected current are likewise ensured without forming another semiconductor region as the partitioning portion. Thereby, a high detection accuracy can be obtained in a reduced chip size.

BRIEF DESCRIPTION OF THE DRAWINGS

The above and other objects, features and advantages of the present invention will be better understood from the following description taken in conjunction with the accompanying drawings, in which:

FIG. 21 is an example of a main circuit of inverter equipment utilizing protection circuit built-in IGBTs according to the invention.

PREFERRED EMBODIMENTS

FIRST EMBODIMENT

Figure 1:
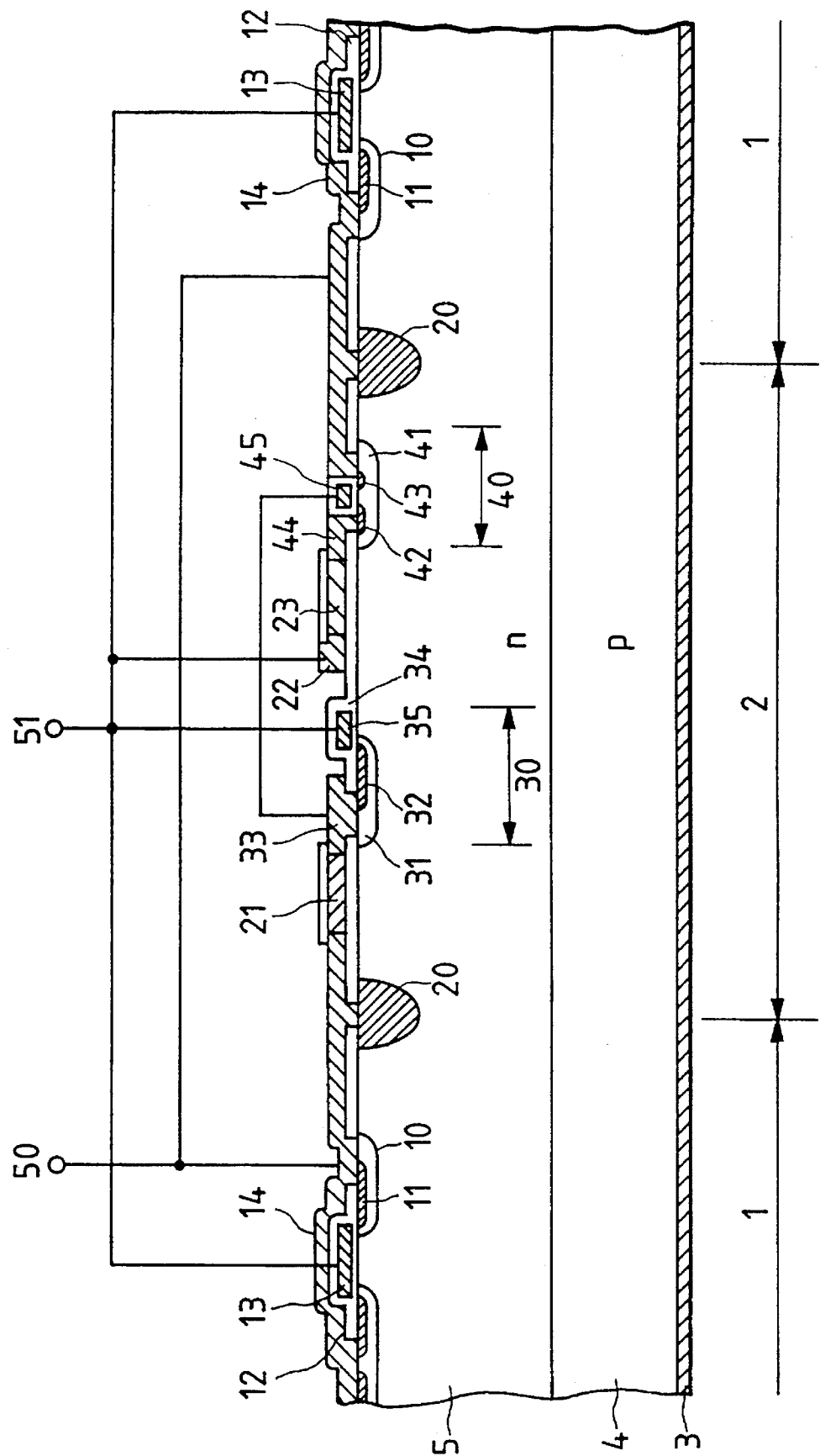
FIG. 1 is a cross-sectional view of one embodiment of the invention.
Figure 2:
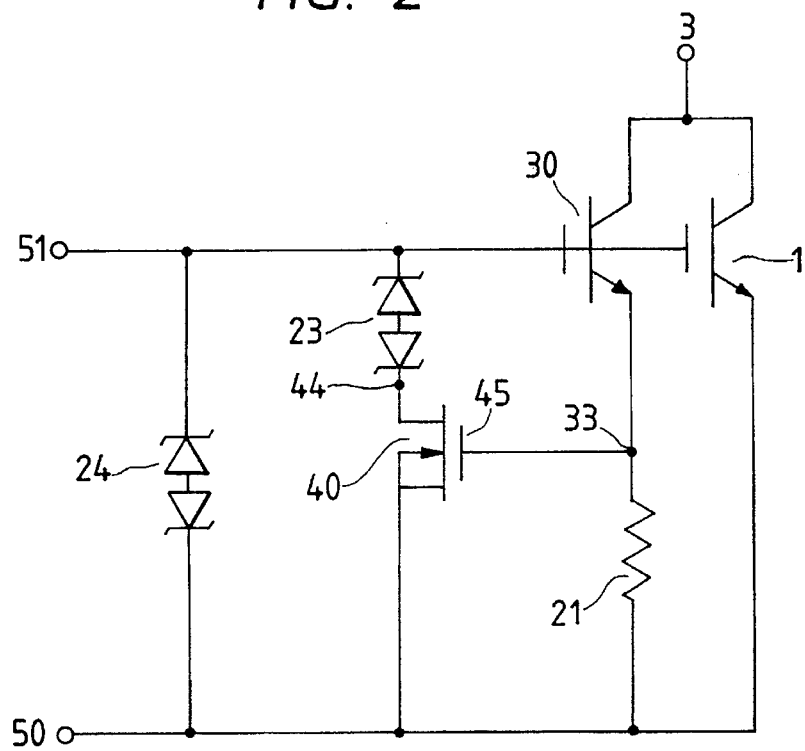
FIG. 2 is an equivalent circuit of the one embodiment of FIG. 1.
Figure 3:
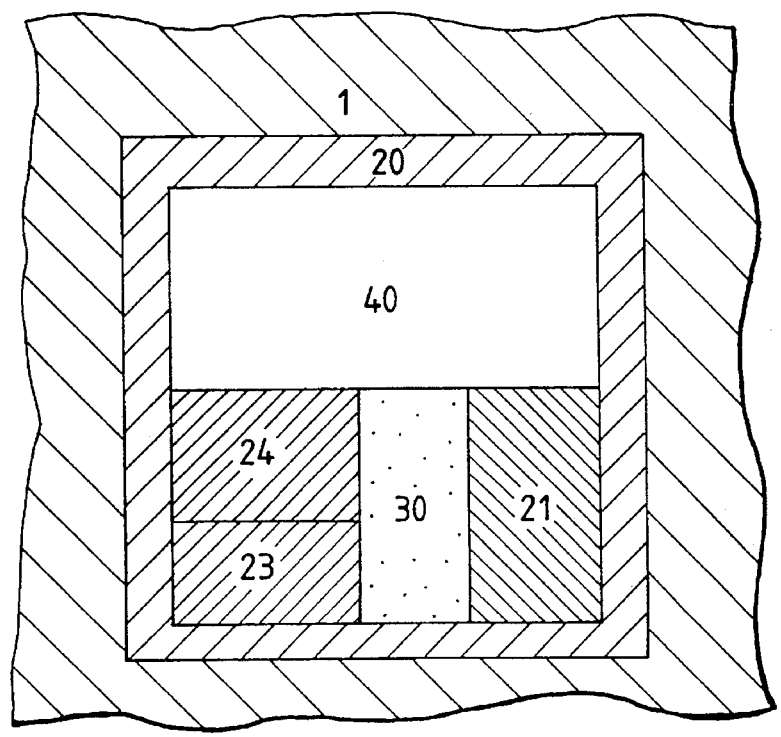
FIG. 3 is a plan view of the one embodiment of FIG. 1 indicative of its planar arrangement.

With reference to FIGS. 1, 2 and 3, one preferred embodiment of the invention wherein protection circuit built-in IGBTs of the invention are applied will be described in detail in the following, where FIG. 1 shows part of its cross-sectional structure, FIG. 2 is an equivalent circuit thereof, and FIG. 3 is a plan view indicative of planar arrangement of each of the elements thereof.

In FIG. 1, respective elements formed on the top surface of a semiconductor substrate are shown to have been connected via wiring represented by solid lines for conveniences of drawing, however, actually, they are connected via an aluminum layer or a polycrystalline silicon layer formed on the surface of the semiconductor substrate.

In FIGS. 1, 2 and 3, each numeral designates each part as follows. 1: main IGBT region, 2: protection circuit region, 3: collector electrode, 4: p-type collector layer, 5: n-type drift layer, 10: p-type base layer, 11: n-type source layer, 12: gate insulation film, 13: insulated gate electrode, 14: emitter electrode, 20: p-type well portion which acts as a partitioning portion; 21: sense resistance, 22: anode electrode of Zener diode, 23: Zener diode for limiting gate voltage, 24: gate input protection diode, 30: sense IGBT, 31: p-type base layer of the sense IGBT for current detection, 32: n-type source layer of the sense IGBT, 33: emitter electrode of the sense IGBT, 34: gate insulation film for sense IGBT, 35: insulated gate electrode of the sense IGBT, 40: MOSFET of the protection circuit, 41: p-type base layer of the MOSFET 40, 42: n-type drain layer of the MOSFET 40, 43: n-type source layer of the MOSFET 40, 44: drain electrode of the MOSFET 40, 45: gate electrode of the MOSFET 40, 50: emitter electrode terminal, and, 51: gate electrode terminal. In this arrangement, p-type well portion 20 is in contact with emitter electrode 14, and further, protection circuit region 2 is surrounded by p-type well portion 20. By way of example, the p-type well portion 20 may have a continuous pattern of form or a plurality of separated divisions. Further, it is not limited to the pattern of arrangements of the protection circuit and p-type well portion which surrounds the protection circuit according to this embodiment of the invention, but any pattern of such arrangements may be applicable if the p-type well portion 20 is arranged between or on the boundary of the main IGBT and the protection circuit.

The action of the protection circuit will be described briefly in the following with reference to FIG. 2. When a short-circuit current flows through the main IGBT 1 a current flowing through sense IGBT 30 coupled in parallel with the main IGBT 1 increases, accordingly increasing a potential difference across a sense resistance 21. A gate potential of MOSFET 40 which is coupled to one end of the sense resistance 21 will increase accordingly. When a gate voltage of MOSFET 40 increases to exceed its threshold value voltage, MOSFET 40 becomes on-state. In consequence, a potential at a gate electrode terminal 51 is allowed to decrease to a sum of a breakdown voltage of Zener diode 23 and an on-voltage of MOSFET 40. Thereby, the short-circuit current flowing through the main IGBT 1 is limited so as to prevent its components from breakdown. Further, an input protection Zener diode 24 is provided to protect the gate by causing a short-circuit therethrough when an overvoltage is applied to the electrode terminal 51. Although the arrangement of FIG. 2 operates very effectively, it is noted that the protection circuit is not limited to the specific arrangement of FIG. 2 since a variety of such circuit configurations may be contemplated within the scope of the invention.

According to this embodiment of the invention, since the p-type well portion 20 in contact with emitter electrode 14 is formed between the main IGBT region 1 and the protection circuit region 2, when a main current flows through the main IGBT region, carriers that tend to flow from the main IGBT region into the protection region are scooped and extracted through the p-type well portion 20 to the emitter electrode 14. Thereby, even when an overcurrent is caused to flow therethrough, any semiconductor element in the protection circuit formed in the semiconductor substrate within the protection circuit region can be prevented from malfunctioning due to such carriers. Further, since any excessive current can be prevented from flowing into the sense IGBT, an excellent linearity can be ensured for the main current flowing through the main IGBT and a detection current flowing through the sense IGBT as well.

Further, since the components which constitute the protection circuit according to the invention are formed within the region surrounded by p-type well portion 20 as indicated in FIGS. 1 and 3, lengths of wiring from the sense IGBT which serves as a detection element to the insulated gate electrode 35 of MOSFET 40 of the protection circuit, and to sense resistance 21 can be substantially reduced, thereby, parasitic resistance and parasitic inductance involved in wiring can be minimized, thus, eliminating adverse effects due to such.

More specifically, with reference to FIG. 2, assume that a wiring resistance from emitter electrode 33 of sense IGBT to the insulated gate electrode 45 of MOSFET 40 is r, and a capacitance of the insulated gate electrode 45 of MOSFET 40 is $C_{MOS}$, then a charging time required for charging the insulated gate electrode 45 of MOSFET 40 will be determined by a time constant of $C_{MOS} \times r$. When this time constant becomes greater, a longer time is required to charge the gate electrode of the MOSFET 40, which results in a delay in start of action of the protection circuit during an overcurrent situation. It is, therefore, required to reduce either the gate capacitance $C_{MOS}$ or wiring resistance r. However, since the polycrystalline silicon of the gate electrode 45 is often formed simultaneously with other elements, it is difficult to adjust the gate capacitance $C_{MOS}$ alone. Thereby, it is required to minimize the wiring resistance r. This can be achieved by arranging and forming both the sense IGBT and the protection circuit elements within the region surrounded by the p-type well portion as implemented by this embodiment of the invention. Thereby, a time lag from a start of an overcurrent until when the protection circuit starts its action can be reduced.

SECOND EMBODIMENT

Figure 4:
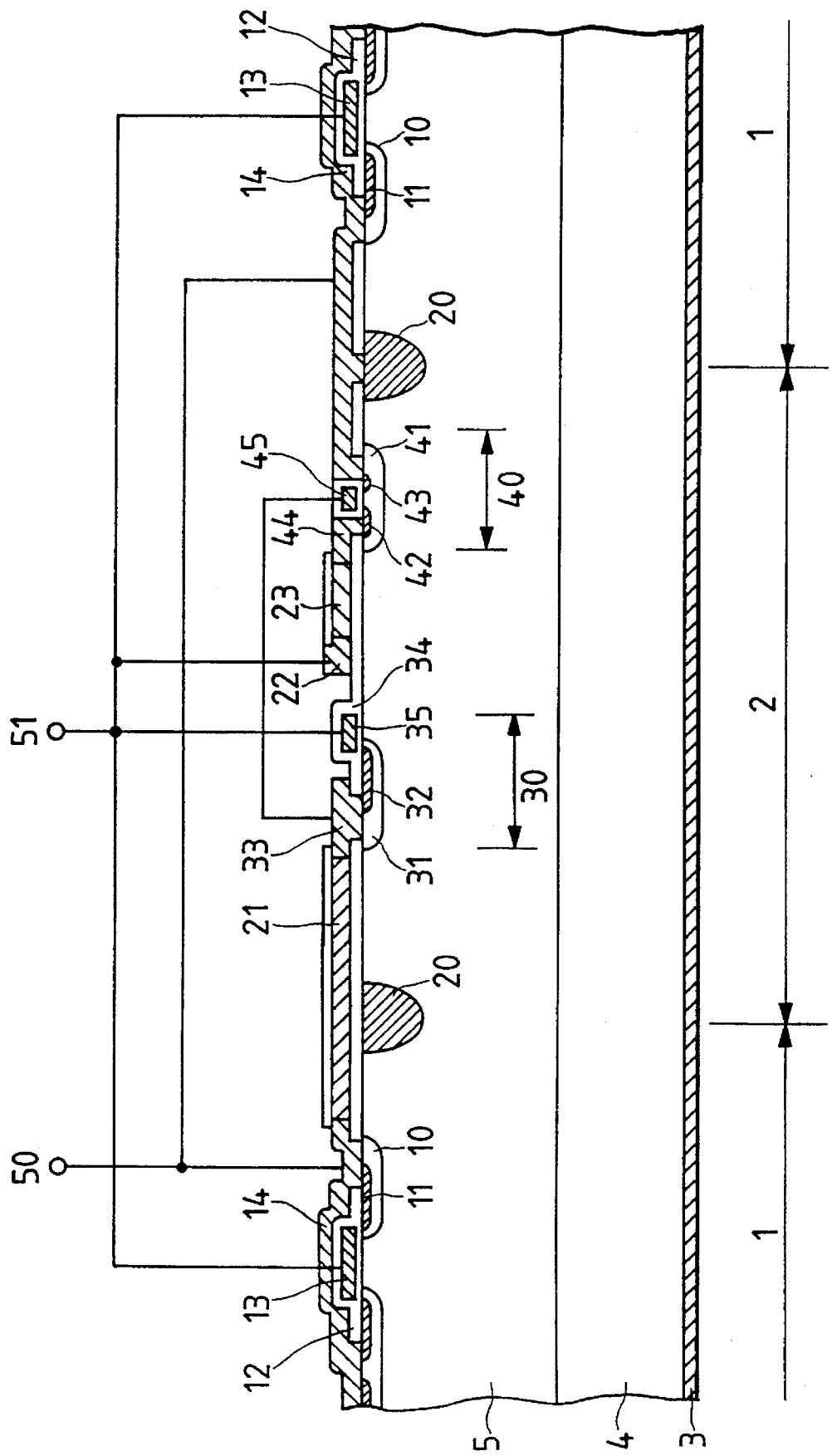
FIG. 4 is a cross-sectional view of a second embodiment of the invention.
Figure 5:
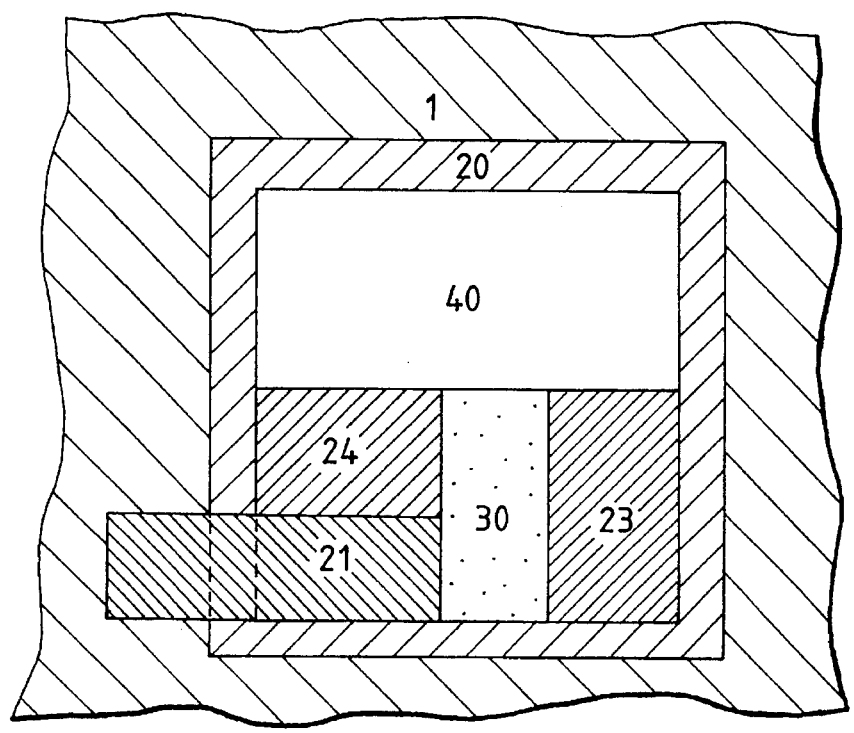
FIG. 5 is a plan view of the second embodiment of the invention indicative of its planar arrangement.

With reference to FIGS. 4 and 5, there is shown a modification of the embodiment 1 of the invention, in which part of the elements that constitute its protection circuit is formed extending out of the region surrounded by its p-type well portion 20. FIG. 4 is a cross-sectional view in part thereof, and FIG. 5 is a plan view thereof indicative of arrangements of respective elements. In this embodiment 2, part of sense resistance 21 extends over p-type well portion 20, and is formed extending outside the p-type well portion 20. The sense resistance 21 is formed on an oxide film to be insulated from the p-type well portion 20. Only the sense resistance 21 is shown in this embodiment in such arrangement, however, it is not limited thereto, and any other element of the protection circuit components can be implemented in the same manner provided that it is formed on an oxide film.

According to the embodiment 2, a degree of freedom in layout of elements will substantially increase. Therefore, a substantial reduction in chip size can be implemented by optimizing the layout. Further, in view of minimizing of lengths of wiring between respective elements on the chip, an optimum layout of elements which ensures the fastest protection operation can be obtained.

THIRD EMBODIMENT

Figure 6:
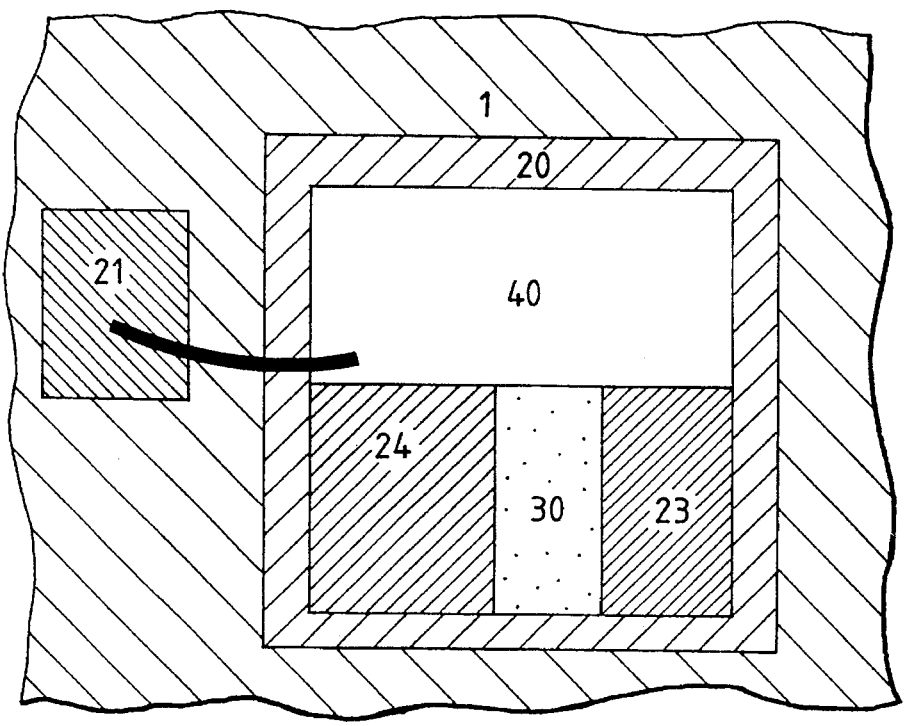
FIG. 6 is a plan view of a third embodiment of the invention indicative of its planar arrangement.

FIG. 6 is a plan view in part of a modification of the embodiment 2, which will be referred to as a third embodiment, in which one of the constituting elements of its protection circuit is formed outside its p-type well portion 20. In this instance, some wiring is needed to connect between part 21 of protection circuit element that has been formed outside the p-type well portion 20 and another protection circuit element within the p-type well portion 20. Although wiring using aluminum is shown in FIG. 6, but it is not limited thereto, and any other wiring, for example, using an aluminum layer formed on the surface of the semiconductor substrate, may be applicable in the same manner.

According to this embodiment 3 of the invention, a degree of freedom in layout of elements increases likewise to the preceding embodiment 2.

FOURTH EMBODIMENT

Figure 7:
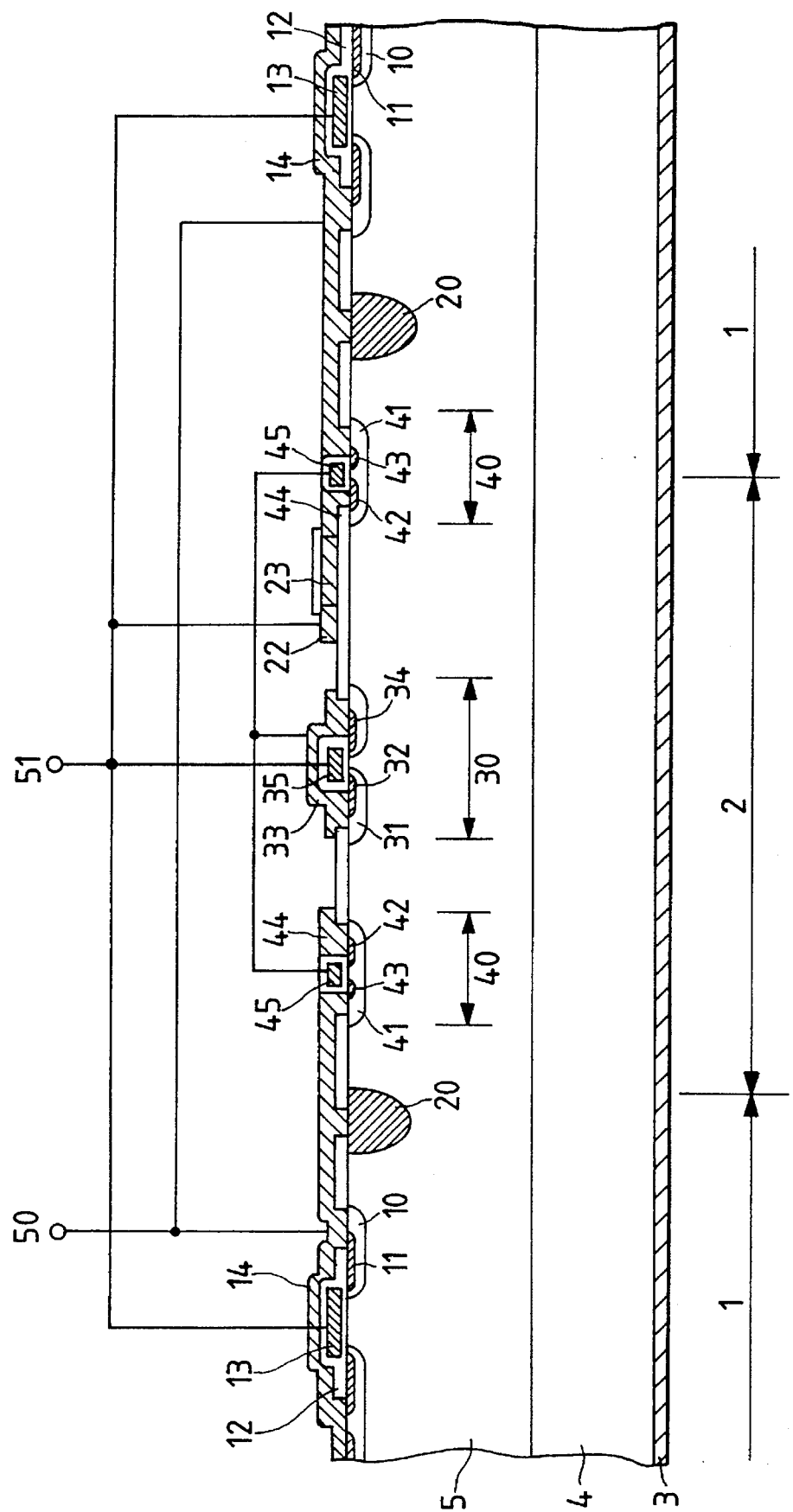
FIG. 7 is a cross-sectional view of a fourth embodiment of the invention.
Figure 8:
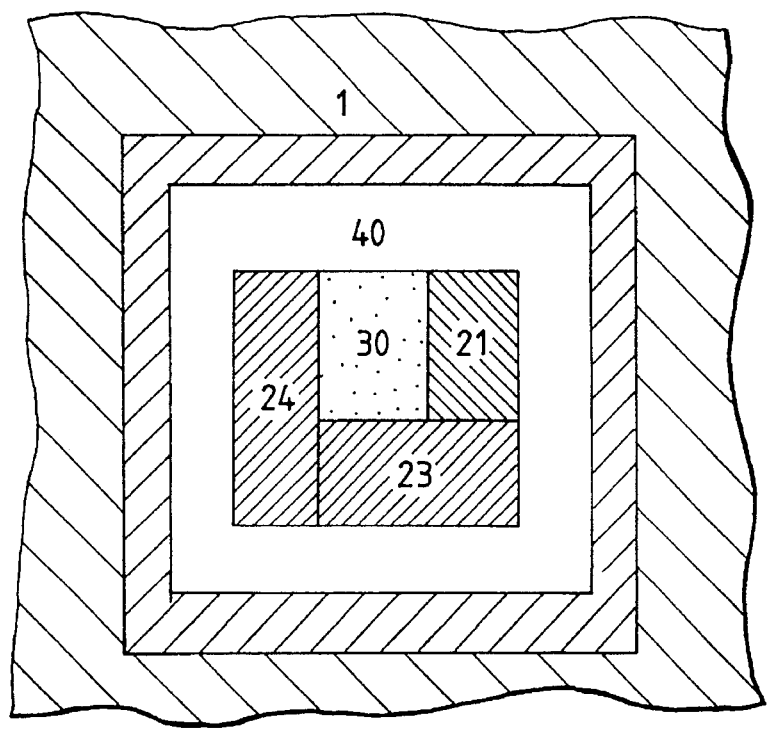
FIG. 8 is a plan view of the fourth embodiment of the invention indicative of its planar arrangement.

With reference to FIGS. 7 and 8, there is shown a fourth embodiment of the invention, which has been applied to the protection circuit built-in IGBT. FIG. 7 is a cross-sectional view in part thereof, and FIG. 8 is a plan view indicative of arrangements of respective elements thereof.

In this fourth embodiment, a ground potential layer of MOSFET 40 of its protection circuit, which corresponds to base layer 41 of the MOSFET, is adapted to surround its sense IGBT. By way of example, MOSFET 40 may have a continuous pattern of shape or a discrete pattern with plural divisions thereof.

Since the p-type base layer 41 of MOSFET 40 is in contact with the emitter electrode in conjunction with p-type well portion 20, substantially the same effect to extract carriers therethrough can be attained. Thereby, according to this embodiment, because the sense IGBT is surrounded doubly both by p-type well portion 20 and MOSFET 40, any interference between the main IGBT and sense IGBT can be effectively and reliably prevented, thereby, substantially improving linearity between a main current flowing through the main IGBT and a detection current flowing through the sense IGBT.

FIFTH EMBODIMENT

Figure 10:
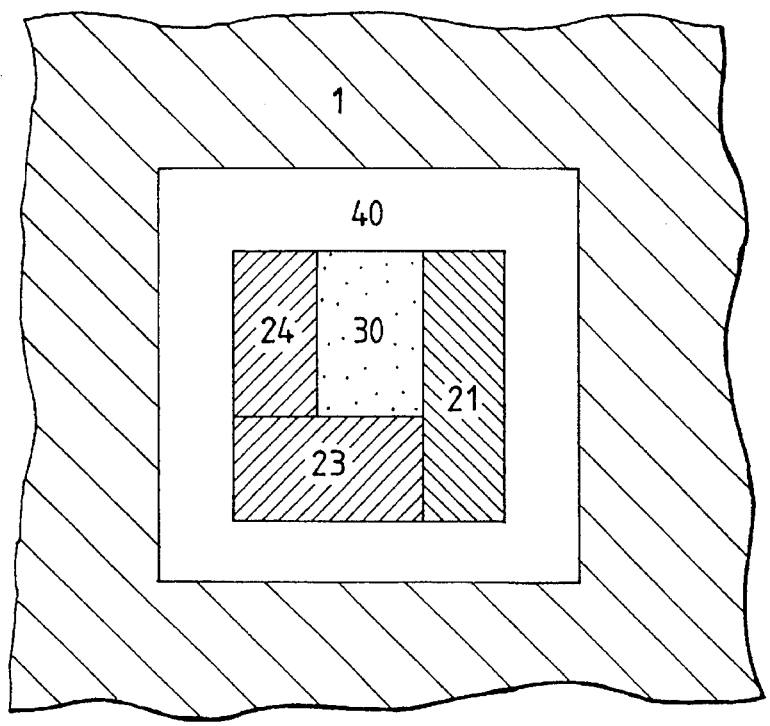
FIG. 10 is a plan view of the fifth embodiment of the invention indicative of its planar structure.
Figure 9:
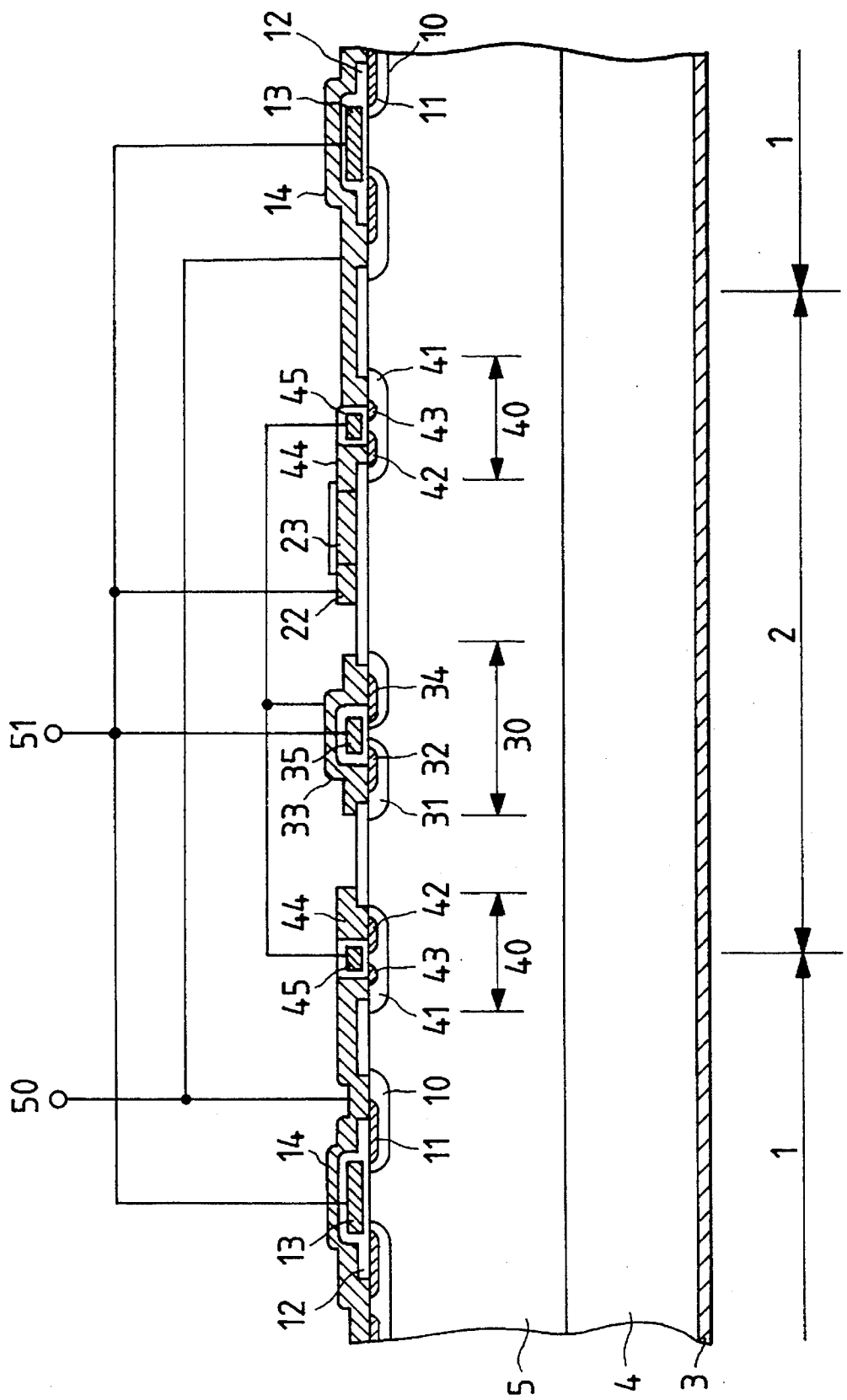
FIG. 9 is a cross-sectional view of a fifth embodiment of the invention.

With reference to FIGS. 9 and 10, there is shown a fifth embodiment of the invention which has been applied to the protection circuit built-in IGBT. FIG. 9 is a cross-sectional view in part thereof, and FIG. 10 is a plan view indicative of arrangements of respective elements thereof.

In this fifth embodiment of the invention, it is arranged such that the periphery of sense IGBT 30 is surrounded, not by p-type well portion 20 which is not formed in this instance, but by a ground potential layer of MOSFET 40, which corresponds to p-type base layer 41 of MOSFET 40. Advantages and merits according to this embodiment are substantially the same as those achieved by the first embodiment of the invention. Since the same advantages and effect as those of the first embodiment of the invention can be attained according to this embodiment without forming p-type well portion 20, it is possible further to reduce the area of the protection circuit, thereby minimizing the chip size thereof.

SIXTH EMBODIMENT

Figure 11:
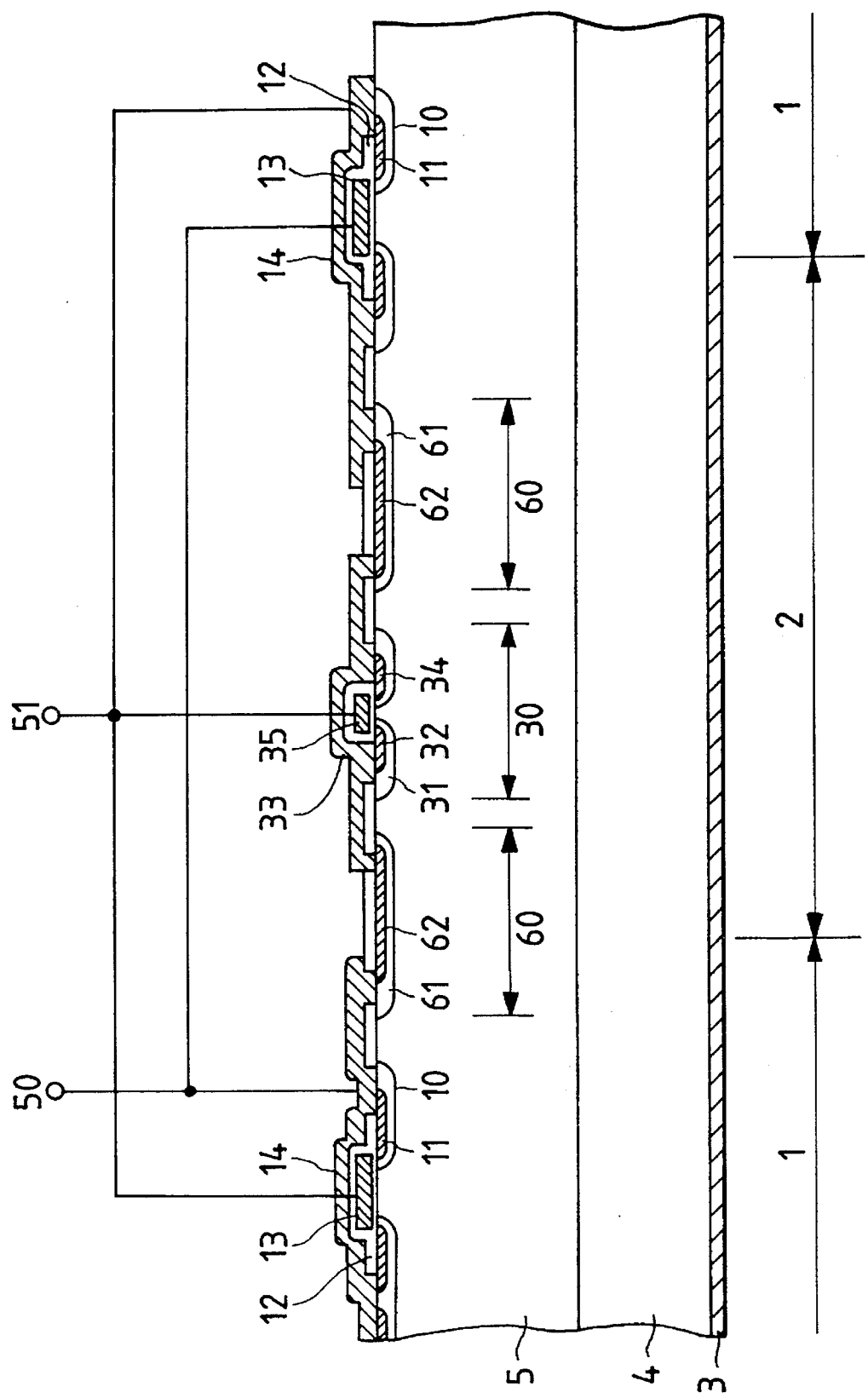
FIG. 11 is a cross-sectional view of a sixth embodiment of the invention.
Figure 12:
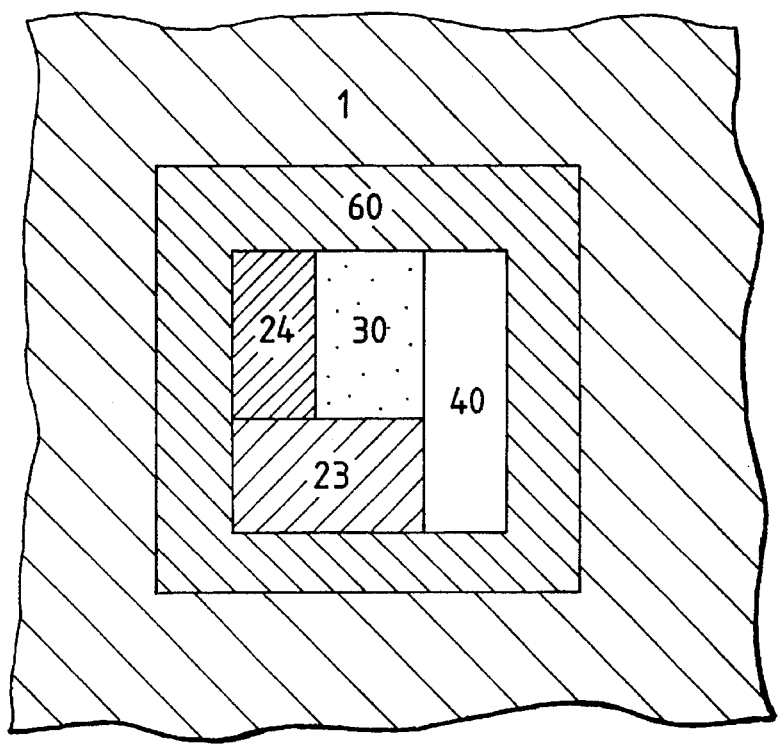
FIG. 12 is a plan view of the sixth embodiment of the invention indicative of its planar arrangement.

With reference to FIGS. 11 and 12, there is shown a sixth embodiment of the invention, which has been applied to the protection circuit built-in IGBT. FIG. 11 is a cross-sectional view in part thereof, and FIG. 12 is a plan view indicative of arrangements of respective elements thereof. In the drawings of FIGS. 11 and 12, 60 denotes an embedded sense resistance formed in a silicon substrate, 61 denotes a p-type base layer of the embedded sense resistance, and 62 is an n-type resistance layer of the embedded sense resistance. The p-type base layer 61 of the embedded sense resistance is in contact with emitter electrode 14.

This sixth embodiment of the invention is implemented by substituting an embedded sense resistance 60 for MOSFET 40 which surrounds the periphery of the sense IGBT 30 in the fifth embodiment of the invention. Because the p-type base layer 61 of the embedded sense resistance has the same effect to extract excessive carriers as that of the p-type well portion 20, the advantages and merits attainable by the sixth embodiment are substantially identical with those of the first embodiment. In addition, likewise to the fifth embodiment, it is possible to reduce the chip size as well.

SEVENTH EMBODIMENT

Figure 14:
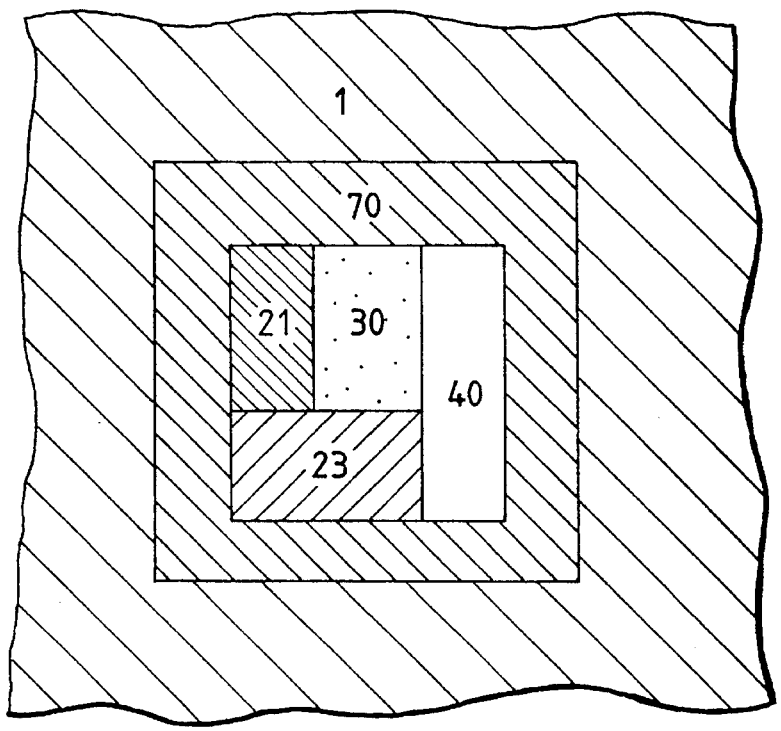
FIG. 14 is a plan view of the seventh embodiment indicative of its planar arrangement.
Figure 13:
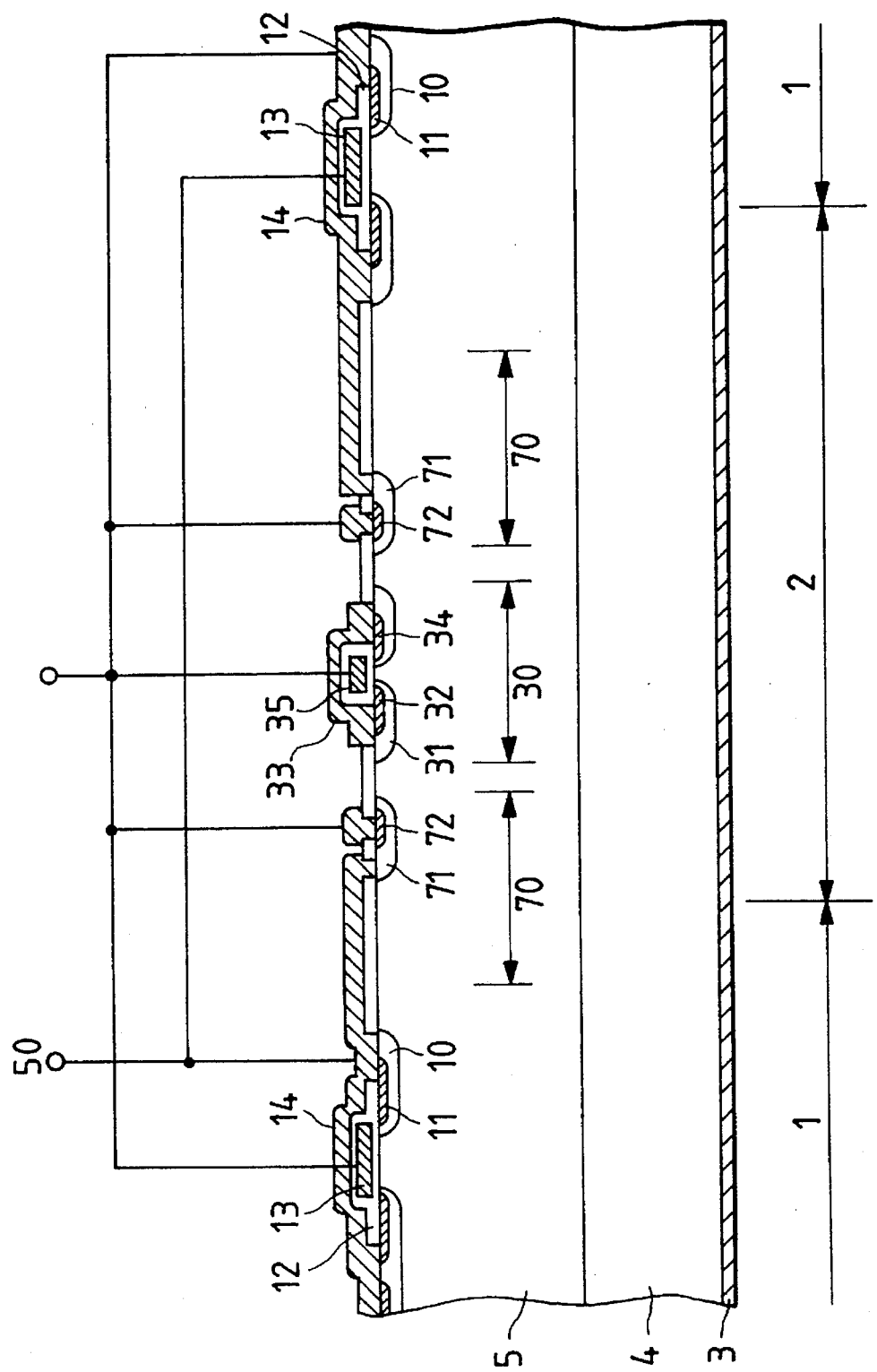
FIG. 13 is a cross-sectional view of a seventh embodiment of the invention.

With reference to FIGS. 13 and 14, there is shown a seventh embodiment of the invention which has been applied to the protection circuit built-in IGBT. FIG. 13 is a cross-sectional view in part thereof, and FIG. 14 is a plan view indicative of arrangements of respective elements thereof. In the drawings of FIGS. 13 and 14, numeral 70 denotes an embedded Zener diode formed in its semiconductor substrate, 71 denotes a p-type base layer of the embedded Zener diode, and 72 denotes an n-type cathode layer of the embedded Zener diode.

This seventh embodiment is implemented by substituting an embedded Zener diode 70 for the embedded sense resistance 60 in the sixth embodiment of the invention that has been adapted to surround the sense IGBT. The advantage and effect according to this embodiment is substantially the same as those according to the first embodiment or the fifth embodiment.

EIGHTH EMBODIMENT

The above-mentioned embodiments have been described to deal with such instances in which the sense IGBT is surrounded by a single element such as a MOSFET or resistance. However, it is not limited thereto, and any method for surrounding the sense IGBT with plural protection circuit constituent elements in combination will also be effective. Some of such embodiments of the invention will be described in the following.

Figure 15:
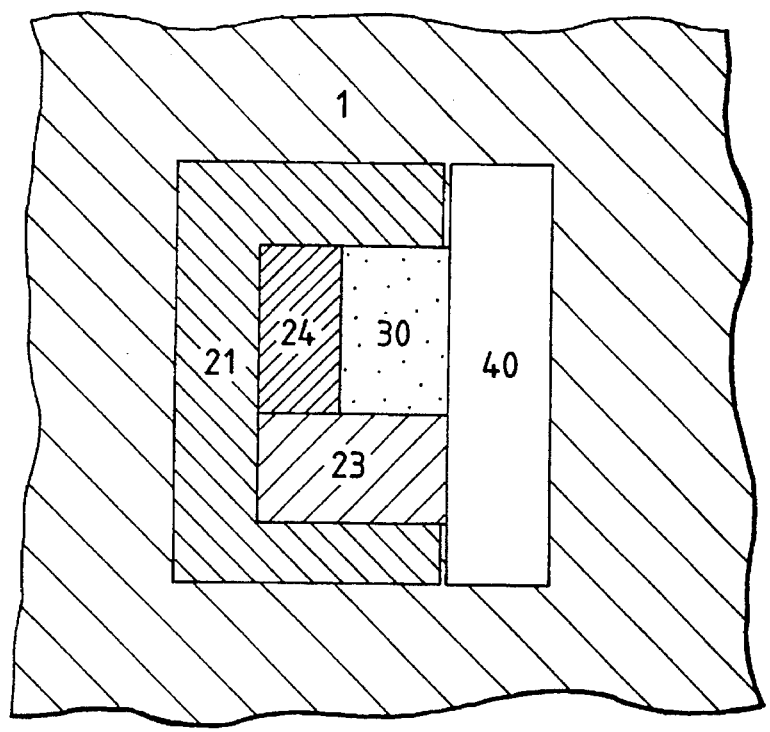
FIG. 15 is a plan view of an eighth embodiment of the invention indicative of its planar arrangement.

With reference to FIG. 15, there is shown an eighth embodiment of the invention that has been applied to the protection circuit built-in IGBT. FIG. 15 is a plan view indicative of arrangements of the protection circuit constituent elements.

It is possible to obtain the same effect as obtained by the first embodiment of the invention by arranging the circuitry such that MOSFET 40 and resistance 21 in combination are disposed to surround the periphery of sense IGBT 30 as shown in FIG. 15. A degree of freedom in layout increases by surrounding the periphery of sense IGBT 30 utilizing plural elements in combination that constitute the protection circuit. Thereby, it becomes possible to reduce its chip size through optimization of layout. Further, in view of reducing lengths of wiring between respective elements, it is possible to work out a most appropriate layout that ensures a fastest operation of protection to be executed.

In this embodiment, the protection MOSFET and sense resistance are utilized in conjunction to surround the periphery of sense IGBT, however, it is not limited thereto, and the same effect can be achieved by combining other plural elements of the protection circuit including a Zener diode and the like.

NINTH EMBODIMENT

Figure 16:
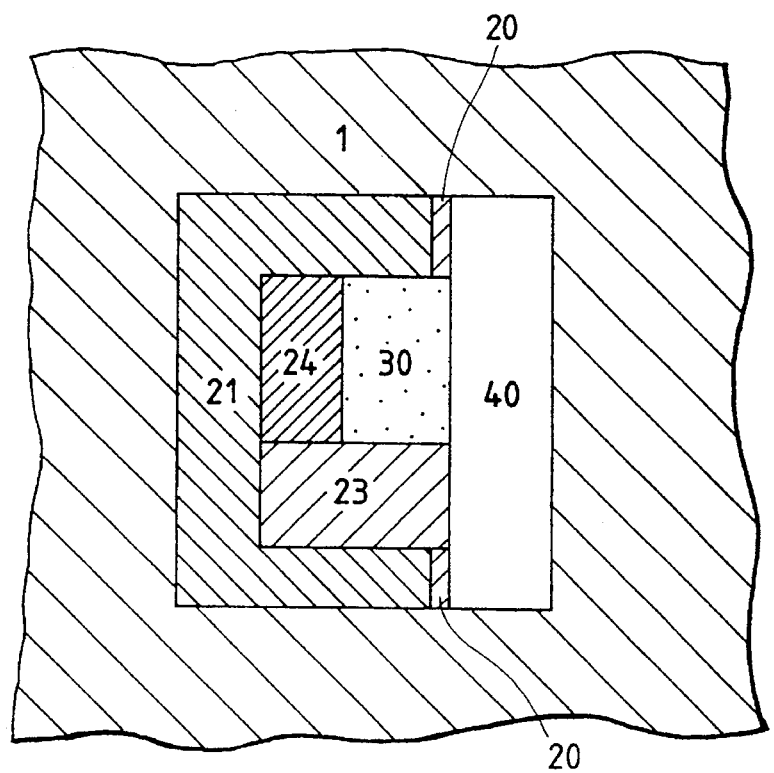
FIG. 16 is a plan view of a ninth embodiment of the invention indicative of its planar arrangement.

FIG. 16 is a ninth embodiment of the invention that has been applied to the protection circuit built-in IGBT. FIG. 16 is a plan view indicative of arrangements of respective elements which constitute the protection circuit.

In this ninth embodiment, a p-type well portion 20 is formed in a discontinuous portion, i.e., a gap between elements that constitute its protection circuit to surround the periphery of its sense IGBT 30 such that the periphery of sense IGBT 30 is completely surrounded by ground potential layers. Thereby, linearity between the current flowing through sense IGBT 30 and the current flowing through the main IGBT is ensured to be maintained.

TENTH EMBODIMENT

There have been described some examples of methods for surrounding the sense IGBTs for protection utilizing a single or plural elements of the protection circuit. However, depending on a particular configuration of protection circuits, elements to be used for surrounding the IGBT and their surrounding methods may take a variety of modifications within the scope of the invention with the same advantage and merit.

All of the embodiments of the invention described above have been given as having been applied to IGBTs, however, it is not limited thereto, and it may also be applied to any other semiconductor devices having an insulated gate element with the same configuration to achieve the same advantage and merit of the subject invention. One of such embodiments applied to other than IGBTs will be described below.

Figure 17:
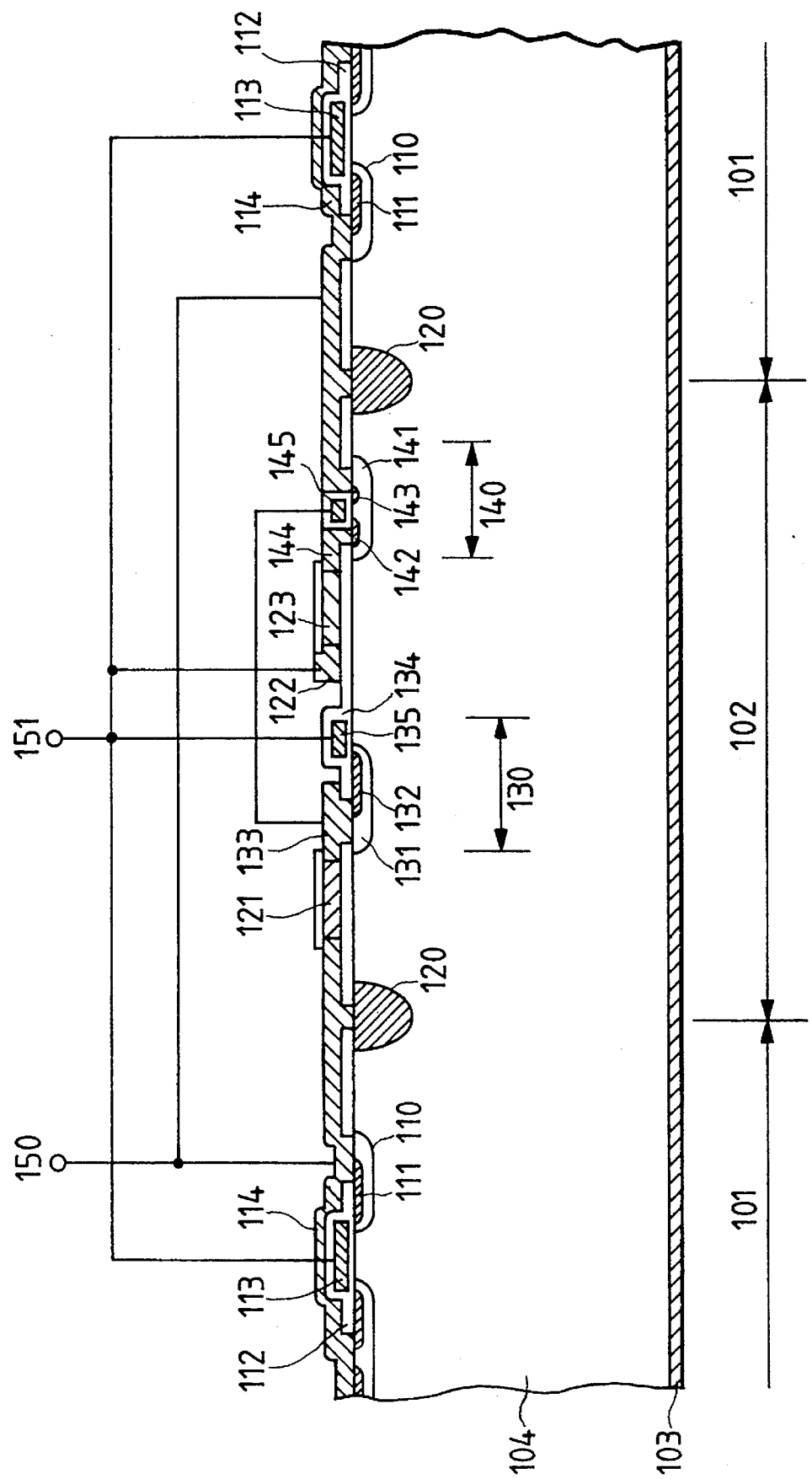
FIG. 17 is a cross-sectional view of a tenth embodiment of the invention.
Figure 18:
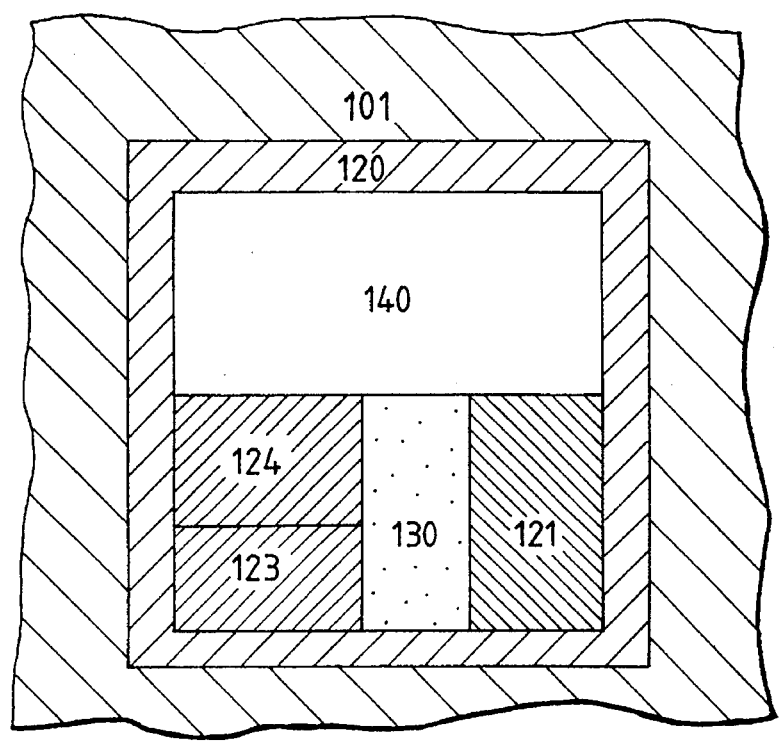
FIG. 18 is a plan view of the tenth embodiment of the invention indicative of its planar arrangement.

With reference to FIGS. 17 and 18, there is shown a tenth embodiment of the invention that has been applied to a protection circuit built-in MOSFET. FIG. 17 is a cross-sectional view in part thereof, and FIG. 18 is a plan view indicative of the arrangement of respective elements therein. In the drawings of FIGS. 17 and 18, 101 is a MOSFET region, 102 is a protection circuit region, 103 is a drain electrode, 104 is an n-type drift region, 110 is a p-type base layer, 111 is an n-type source layer, 112 is a gate insulation film, 113 is an insulated gate electrode, 114 is a source electrode, 120 is a p-type well portion, 121 is a sense resistance, 122 is an anode electrode of a Zener diode, 123 is a gate voltage limiting Zener diode, 130 is a sense MOSFET, 131 is a p-type base layer of sense MOSFET, 132 is an n-type source layer of sense MOSFET, 133 is a source electrode of sense MOSFET, 134 is a gate insulation film of sense MOSFET, 135 is an insulated gate electrode of sense MOSFET, 140 is a MOSFET of the protection circuit, 141 is a p-type base layer of protection circuit MOSFET, 142 is an n-type drain layer of protection circuit MOSFET, 143 is an n-type source layer of protection circuit MOSFET, 144 is a drain electrode of protection circuit MOSFET, 145 is an insulated gate electrode of protection circuit MOSFET, 150 is a source electrode terminal, and 151 is a gate electrode terminal.

This tenth embodiment of the invention is implemented by substituting a MOSFET for the IGBT in the first embodiment, in consequence advantageously ensuring the linearity of current between the main MOSFET 101 and the sense MOSFET 130 to be maintained likewise to the case in the first embodiment. Although in this embodiment it is indicated only to substitute a MOSFET for an IGBT in the first embodiment, this modification is not limited to only the first embodiment, and IGBTs in the other embodiments from 2 to 9 may also be replaced by MOSFETs to achieve the same advantage and effect as well.

ELEVENTH EMBODIMENT

Figure 20:
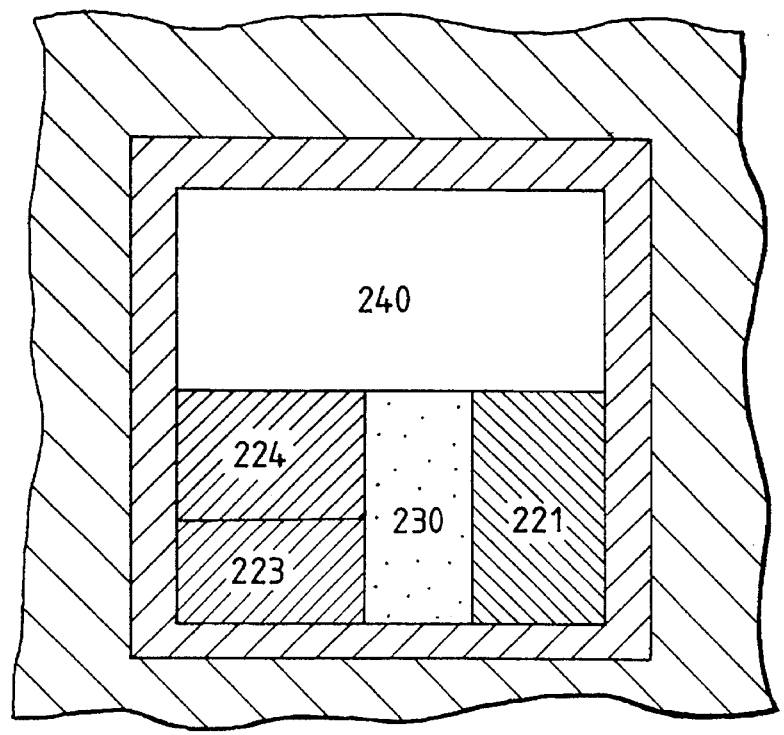
FIG. 20 is a plan view of the eleventh embodiment of the invention indicative of its planar arrangement.
Figure 19:
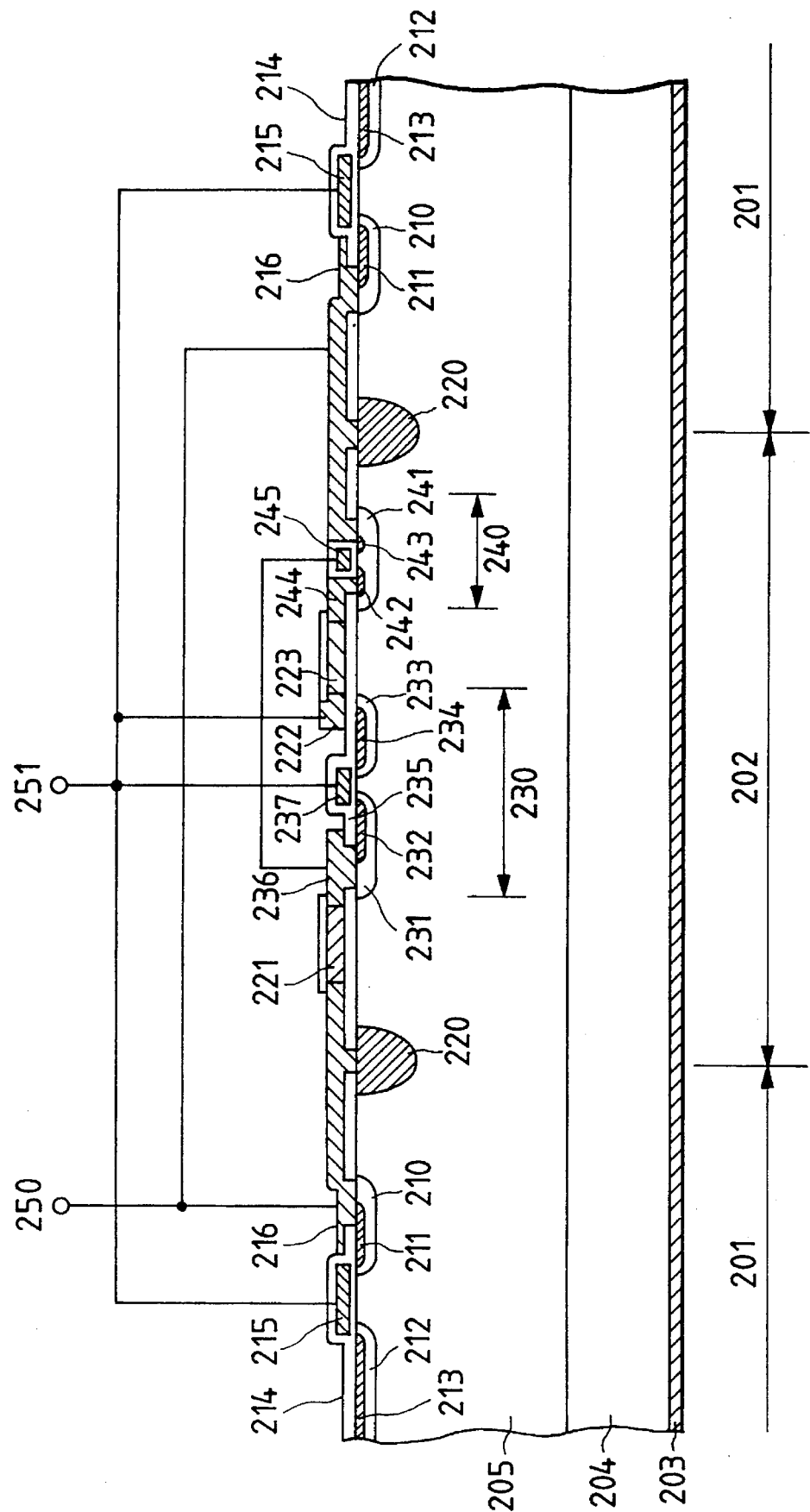
FIG. 19 is a cross-sectional view of an eleventh embodiment of the invention.

With reference to FIGS. 19 and 20, there is shown an eleventh embodiment of the invention that has been applied to a protection circuit built-in emitter switch thyristor (hereinafter referred to as an EST). FIG. 19 is a cross-sectional view in part thereof, and FIG. 20 is a plan view indicative of the arrangement of respective elements therein.

In the drawings of FIGS. 19 and 20, 201 is an EST region, 202 is a protection circuit region, 203 is an anode electrode, 204 is a p-type anode region, 205 is an n-type drift region, 210 is a p-type base layer, 211 is an n-type cathode layer, 212 is a p-type float base layer, 213 is an n-type float layer, 214 is a gate insulation film, 215 is an insulated gate electrode, 216 is a cathode electrode, 220 is a p-type well portion, 221 is a sense resistance, 222 is an anode electrode of Zener diode, 223 is a gate voltage limiting Zener diode, 230 is a sense EST, 231 is a p-type base layer of sense EST, 232 is an n-type cathode layer of sense EST, 233 is a p-type float base layer of sense EST, 234 is an n-type float layer of sense EST, 235 is a gate insulation film of sense EST, 236 is a cathode electrode of sense EST, 237 is an insulated gate electrode of sense EST, 240 is a MOSFET, 241 is a p-type base layer of MOSFET, 242 is an n-type drain layer of MOSFET, 243 is an n-type source layer of MOSFET, 244 is a drain electrode of MOSFET, 245 is a gate electrode of MOSFET, 250 is a cathode electrode terminal, and 251 is a gate electrode terminal.

This eleventh embodiment of the invention is implemented by substituting an EST for the IGBT in the first embodiment, in consequence advantageously ensuring the linearity of current between the main EST and the sense EST to be maintained likewise to the first embodiment. Although this embodiment is illustrated only by an instance of substituting the EST for the IGBT in the first embodiment, however, it is not limited thereto, and IGBTs in the other embodiments from 2 to 9 may also be replaced by ESTs to achieve the same advantage and effect as well.

There have been described some examples of the invention that have been applied to IGBTs, MOSFETs and ESTs, however, it is not limited thereto, and the subject invention may be applied to any other vertical-type insulated gate type semiconductor devices provided with a protection circuit, and to any modifications within the scope of the invention to the same advantage and effect.

Still another embodiment of the invention that has been applied to an inverter which utilizes IGBTs according to the invention will be described in the following.

TWELFTH EMBODIMENT

FIG. 21 is a circuit configuration indicative of a twelfth embodiment of the invention that has been applied to an inverter.

In the drawing of FIG. 21, 543 and 544 are a pair of DC terminals coupled to a DC power source E; 545 and 546, 547 and 548, and 549 and 550, connected in series respectively, are switch elements according to the invention, which are then connected respectively in parallel between the pair of DC terminal 543 and 544 in the same polarity arrangement; numerals 551, 552, 553, 554, 555 and 556 are diodes for feeding back a load current, each connected in parallel with each of the foregoing switch elements in the opposite polarity; and 557, 558 and 559 are AC terminals with the same number as the phases (three phases) of AC outputs each taken out from each interconnection point connecting the two switching elements in series. In an electric power conversion apparatus comprising switching elements according to the twelfth embodiment of the invention, there is no need to provide any additional protection circuit for protecting the switching elements, and moreover, it is possible to minimize the size and weight of the apparatus with a reduced cost of production.

We have described the preferred embodiments of the invention hereinabove, however, it should be understood that a variety of modifications and changes may be contemplated within the scope of the invention. For example, the invention is also applicable to such an insulated gate semiconductor device in which a conducting type of each semiconductor layer is reversed.

Still further, the present invention is applicable to an integrated circuit to form a unit element thereof.

As have been described above, according to the present invention, there have been implemented a variety of insulated gate semiconductor devices capable of providing a high reliability and precision protection operation since its protection circuit is protected from any malfunction, and the linearities of the main current and the detection current are ensured to be maintained. Also, there have been implemented a variety of protection circuit built-in insulated gate semiconductor devices capable of reducing overall chip size since the linearities of the main current and the detection current can be improved without providing any partition such as the well portion.

What is claimed is:

1. An insulated gate type semiconductor device comprising:

a first layer of a first conducting type;

a second layer of a second conducting type provided in a first region of said first layer;

a third layer of said first conducting type provided within said second layer;

a fourth layer of said second conducting type provided in a second region of said first layer;

a fifth layer of said first conducting type provided within said fourth layer;

a sixth layer of a second conducting type on which said first layer is provided;

a first electrode in contact with said sixth layer;

a second electrode in contact with said third layer;

a third electrode in contact with said fifth layer;

a first control electrode provided via an insulating film on an exposed portion of said second layer;

a second control electrode provided via an insulating film on an exposed portion of said fourth layer said second control electrode being in contact with said first control electrode;

a circuit including a semiconductor element provided in said second region of said first layer, the semiconductor element being adjacent to said fourth layer, the circuit being coupled to said third electrode; and a semiconductor portion of said second conducting type provided between said first and second regions of said first layer, and not provided between said fourth layer and said semiconductor element, the semiconductor portion being in contact with said second electrode.

2. An insulated gate type semiconductor device comprising:

a first layer of a first conducting type;

a second layer of a second conducting type provided in a first region of said first layer;

a third layer of said first conducting type provided within said second layer;

a fourth layer of said second conducting type provided in a second region of said first layer;

a fifth layer of said first conducting type provided within said fourth layer;

a first electrode coupled to said first layer;

a second electrode in contact with said third layer;

a third electrode in contact with said fifth layer;

a first control electrode provided via an insulating film on an exposed portion of said second layer;

a second control electrode provided via an insulating film on an exposed portion of said fourth layer said second control electrode being in contact with said first control electrode;

a circuit including a semiconductor element provided in said second region of said first layer, the semiconductor element being adjacent to said fourth layer, the circuit being coupled to said third electrode; and a semiconductor portion of said second conducting type provided between said first and second regions of said first layer, and not provided between said fourth layer and said semiconductor element, the semiconductor portion being in contact with said second electrode.

3. The insulated gate type semiconductor device according to claim 1 or 2, wherein said circuit provided in the second region is a protection circuit.

4. The insulated gate type semiconductor device according to claims 1 or 2 wherein said semiconductor portion of said second conducting type which is provided between the first region and the second region comprises a geometrical arrangement to substantially surround the periphery of said fourth layer and the semiconductor element provided in the second region.

5. An insulated gate type semiconductor device comprising:

a first layer of a first conducting type;

a second layer of a second conducting type provided in a first region of said first layer;

a third layer of said first conducting type provided within said second layer;

a fourth layer of said second conducting type provided in a second region of said first layer;

a fifth layer of said first conducting type provided within said fourth layer;

a sixth layer of a second conducting type on which said first layer is provided;

a first electrode in contact with said sixth layer;

a second electrode in contact with said third layer;

a third electrode in contact with said fifth layer;

a first control electrode provided via an insulating film on an exposed portion of said second layer;

a second control electrode provided via an insulating film on an exposed portion of said fourth layer said second control electrode being in contact with said first control electrode; and a circuit including a semiconductor element provided in said second region of said first layer, the semiconductor element having a base layer of said second conducting type in contact with said second electrode, the base layer formed in the second region abutting the first region comprising a geometrical arrangement to surround the periphery of said fourth layer that is formed within the second region, and the circuit being coupled to said third electrode.

6. An insulated gate type semiconductor device comprising:

a first layer of a first conducting type;

a second layer of a second conducting type provided in a first region of said first layer;

a third layer of said first conducting type provided within said second layer;

a fourth layer of said second conducting type provided in a second region of said first layer;

a fifth layer of said first conducting type provided within said fourth layer;

a first electrode in contact with said first layer;

a second electrode in contact with said third layer;

a third electrode in contact with said fifth layer;

a first control electrode provided via an insulating film on an exposed portion of said second layer;

a second control electrode provided via an insulating film on an exposed portion of said fourth layer said second control electrode being in contact with said first control electrode;

a circuit including a semiconductor element provided in said second region of said first layer, the semiconductor element having a base layer of said second conducting type in contact with said second electrode, the base layer formed in the second region abutting the first region comprising a geometrical arrangement to surround the periphery of said fourth layer that is formed within the second region, and the circuit being coupled to said third electrode.

7. The insulated gate semiconductor device according to claim 5 or 6 wherein said circuit provided in said second region comprises a protection circuit.

8. An electric power converter apparatus having a pair of direct current terminals, an identical number of alternating current terminals as the number of phases of the electric power converter apparatus' alternating current output, and an identical number of inverter units coupled in parallel between said pair of direct current terminals as the number of phases of the electric power converter apparatus' alternating current output, each inverter unit having two parallel circuits connected in series and an interconnection point therebetween to be connected to a different alternating current terminal, each of said parallel circuits including a switching element and a reverse polarity diode in parallel connection, wherein said switching element comprises the insulated gate semiconductor device comprising:

a first layer of a first conducting type;

a main IGBT device formed in a first region of said first layer comprising:

a base layer of a second conducting type provided in the first region of said first layer;

a source layer of said first conducting type provided within said base layer;

an emitter electrode in contact with said source layer; and an insulated gate electrode provided on a gate insulation film over an exposed portion of said base layer;

a sense IGBT formed in a second region of the first layer, adjacent to the first region, for sensing an abnormal high current flow condition in said main IGBT, said sense IGBT comprising:

a base layer of said second conducting type provided in the second region of said first layer; and a source layer of said first conducting type provided within said fourth layer;

a first electrode coupled to said second layer;

a second electrode in contact with said source layer of the main IGBT;

a third electrode in contact with said source layer of the sense IGBT;

a first control electrode provided via an insulating film on an exposed portion of said base layer of the main IGBT;

a second control electrode provided via an insulating film on an exposed portion of said base layer of the sense IGBT, said second control electrode being in contact with said first control electrode;

a protection circuit including a protection MOSFET semiconductor element provided in said second region of said first layer, the protection MOSFET being adjacent to said base layer of said sense IGBT, the protection circuit being coupled to said third electrode; and a semiconductor partitioning portion of said second conducting type provided between said first and second regions of said first layer, and not provided between said base layer of the sense IGBT and said protection MOSFET, the semiconductor partitioning portion being in contact with said second electrode.

9. An electric power converter apparatus having a pair of direct current terminals, an identical number of alternating current terminals as the number of phases of the electric power converter apparatus' alternating current output, and an identical number of inverter units coupled in parallel between said pair of direct current terminals as the number of phases of the electric power converter apparatus' alternating current output, each inverter unit having two parallel circuits connected in series and an interconnection point therebetween to be connected to a different alternating current terminal, each of said parallel circuits including a switching element and a reverse polarity diode in parallel connection, wherein said switching element comprises the insulated gate semiconductor device comprising:

a first layer of a first conducting type;

a second layer of a second conducting type provided in a first region of said first layer;

a third layer of said first conducting type provided within said second layer;

a fourth layer of said second conducting type provided in a second region of said first layer;

a fifth layer of said first conducting type provided within said fourth layer;

a first electrode coupled to said first layer;

a second electrode in contact with said third layer;

a third electrode in contact with said fifth layer;

a first control electrode provided via an insulating film on an exposed portion of said second layer;

a second control electrode provided via an insulating film on an exposed portion of said fourth layer said second control electrode being in contact with said first control electrode;

a circuit including a semiconductor element provided in said second region of said first layer, the semiconductor element being adjacent to said fourth layer, the circuit being coupled to said third electrode; and a semiconductor portion of said second conducting type provided between said first and second regions of said first layer, and not provided between said fourth layer and said semiconductor element, the semiconductor portion being in contact with said second electrode.

10. An electric power converter apparatus having a pair of direct current terminals, an identical number of alternating current terminals as the number of phases of the electric power converter apparatus' alternating current output, and an identical number of inverter units coupled in parallel between said pair of direct current terminals as the number of phases of the electric power converter apparatus' alternating current output, each inverter unit having two parallel circuits connected in series and an interconnection point therebetween to be connected to a different alternating current terminal, each of said parallel circuits including a switching element and a reverse polarity diode in parallel connection, wherein said switching element comprises the insulated gate semiconductor device comprising:

a first layer of a first conducting type;

a main IGBT device formed in a first region of said first layer comprising:

a first layer of a first conducting type;

a second layer of a second conducting type provided in a first region of said first layer;

a third layer of said first conducting type provided within said second layer;

a fourth layer of said second conducting type provided in a second region of said first layer;

a fifth layer of said first conducting type provided within said fourth layer;

a sixth layer of a second conducting type on which said first layer is provided;

a first electrode in contact with said sixth layer;

a second electrode in contact with said third layer;

a third electrode in contact with said fifth layer;

a first control electrode provided via an insulating film on an exposed portion of said second layer;

a second control electrode provided via an insulating film on an exposed portion of said fourth layer said second control electrode being in contact with said first control electrode; and a circuit including a semiconductor element provided in said second region of said first layer, the semiconductor element having a base layer of said second conducting type in contact with said second electrode, the base layer formed in the second region abutting the first region comprising a geometrical arrangement to surround the periphery of said fourth layer that is formed within the second region, and the circuit being coupled to said third electrode.

11. An electric power converter apparatus having a pair of direct current terminals, an identical number of alternating current terminals as the number of phases of the electric power converter apparatus' alternating current output, and an identical number of inverter units coupled in parallel between said pair of direct current terminals as the number of phases of the electric power converter apparatus' alternating current output, each inverter unit having two parallel circuits connected in series and an interconnection point therebetween to be connected to a different alternating current terminal, each of said parallel circuits including a switching element and a reverse polarity diode in parallel connection, wherein said switching element comprises the insulated gate semiconductor device comprising:

a first layer of a first conducting type;

a main IGBT device formed in a first region of said first layer comprising:

a first layer of a first conducting type;

a second layer of a second conducting type provided in a first region of said first layer;

a third layer of said first conducting type provided within said second layer;

a fourth layer of said second conducting type provided in a second region of said first layer;

a fifth layer of said first conducting type provided within said fourth layer;

a first electrode in contact with said first layer;

a second electrode in contact with said third layer;

a third electrode in contact with said fifth layer;

a first control electrode provided via an insulating film on an exposed portion of said second layer;

a second control electrode provided via an insulating film on an exposed portion of said fourth layer said second control electrode being in contact with said first control electrode;

a circuit including a semiconductor element provided in said second region of said first layer, the semiconductor element having a base layer of said second conducting type in contact with said second electrode, the base layer formed in the second region abutting the first region comprising a geometrical arrangement to surround the periphery of said fourth layer that is formed within the second region, and the circuit being coupled to said third electrode.

12. An insulated gate type semiconductor device comprising:

a first layer of a first conducting type;

a main IGBT device formed in a first region of said first layer comprising:

a base layer of a second conducting type provided in the first region of said first layer;

a source layer of said first conducting type provided within said base layer;

an emitter electrode in contact with said source layer; and an insulated gate electrode provided on a gate insulation film over an exposed portion of said base layer;

a sense IGBT formed in a second region of the first layer, adjacent to the first region, for sensing an abnormal high current flow condition in said main IGBT, said sense IGBT comprising:

a base layer of said second conducting type provided in the second region of said first layer; and a source layer of said first conducting type provided within said fourth layer;

a first electrode coupled to said second layer;

a second electrode in contact with said source layer of the main IGBT;

a third electrode in contact with said source layer of the sense IGBT;

a first control electrode provided via an insulating film on an exposed portion of said base layer of the main IGBT;

a second control electrode provided via an insulating film on an exposed portion of said base layer of the sense IGBT, said second control electrode being in contact with said first control electrode;

a protection circuit including a protection MOSFET semiconductor element provided in said second region of said first layer, the protection MOSFET being adjacent to said base layer of said sense IGBT, the protection circuit being coupled to said third electrode; and a semiconductor partitioning portion of said second conducting type provided between said first and second regions of said first layer, and not provided between said base layer of the sense IGBT and said protection MOSFET, the semiconductor partitioning portion being in contact with said second electrode.

13. An insulated gate type semiconductor device according to claim 12, further comprising a second layer interposed between the first layer and the first electrode.

14. An insulated gate type semiconductor device according to claim 12, wherein said first conducting type is n-type and said second conducting type is p-type.

15. An insulated gate type semiconductor device comprising:

a first layer of a first conducting type;

a main IGBT device formed in a first region of said first layer comprising:

a base layer of a second conducting type provided in the first region of said first layer;

a source layer of said first conducting type provided within said base layer;

an emitter electrode in contact with said source layer; and an insulated gate electrode provided on a gate insulation film over an exposed portion of said base layer;

a sense IGBT formed in a second region of the first layer, adjacent to the first region, for sensing an abnormal high current flow condition in said main IGBT, said sense IGBT comprising:

a base layer of said second conducting type provided in the second region of said first layer; and a source layer of said first conducting type provided within said fourth layer;

a first electrode coupled to said second layer;

a second electrode in contact with said source layer of the main IGBT;

a third electrode in contact with said source layer of the sense IGBT;

a first control electrode provided via an insulating film on an exposed portion of said base layer of the main IGBT;

a second control electrode provided via an insulating film on an exposed portion of said base layer of the sense IGBT, said second control electrode being in contact with said first control electrode;

a protection circuit including a protection MOSFET semiconductor element provided in said second region of said first layer, the protection MOSFET being adjacent to said base layer of said sense IGBT, the protection circuit being coupled to said third electrode; and a semiconductor partitioning portion of said second conducting type provided between said first and second regions of said first layer, and not provided between said base layer of the sense IGBT and said protection MOSFET, the semiconductor partitioning portion being in contact with said second electrode and is arranged to extract excess carriers which would otherwise flow into the protection circuit when the abnormal high current flow condition exists in the main IGBT.

16. An insulated gate type semiconductor device according to claim 15, further comprising a second layer interposed between the first layer and the first electrode.

17. An insulated gate type semiconductor device according to claim 15, wherein said first conducting type is n-type and said second conducting type is p-type.

18. An electric power converter apparatus having a pair of direct current terminals, an identical number of alternating current terminals as the number of phases of the electric power converter apparatus' alternating current output, and an identical number of inverter units coupled in parallel between said pair of direct current terminals as the number of phases of the electric power converter apparatus' alternating current output, each inverter unit having two parallel circuits connected in series and an interconnection point therebetween to be connected to a different alternating current terminal, each of said parallel circuits including a switching element and a reverse polarity diode in parallel connection, wherein said switching element comprises the insulated gate semiconductor device comprising:

a first layer of a first conducting type;

a main IGBT device formed in a first region of said first layer comprising:

a first layer of a first conducting type;

a main IGBT device formed in a first region of said first layer comprising:

a base layer of a second conducting type provided in the first region of said first layer;

a source layer of said first conducting type provided within said base layer;

an emitter electrode in contact with said source layer; and an insulated gate electrode provided on a gate insulation film over an exposed portion of said base layer;

a sense IGBT formed in a second region of the first layer, adjacent to the first region, for sensing an abnormal high current flow condition in said main IGBT, said sense IGBT comprising:

a base layer of said second conducting type provided in the second region of said first layer; and a source layer of said first conducting type provided within said fourth layer;

a first electrode coupled to said second layer;

a second electrode in contact with said source layer of the main IGBT;

a third electrode in contact with said source layer of the sense IGBT;

a first control electrode provided via an insulating film on an exposed portion of said base layer of the main IGBT;

a second control electrode provided via an insulating film on an exposed portion of said base layer of the sense IGBT, said second control electrode being in contact with said first control electrode;

a protection circuit including a protection MOSFET semiconductor element provided in said second region of said first layer, the protection MOSFET being adjacent to said base layer of said sense IGBT, the protection circuit being coupled to said third electrode; and a semiconductor partitioning portion of said second conducting type provided between said first and second regions of said first layer, and not provided between said base layer of the sense IGBT and said protection MOSFET, the semiconductor partitioning portion being in contact with said second electrode and is arranged to extract excess carriers which would otherwise flow into the protection circuit when the abnormal high current flow condition exists in the main IGBT.

19. An electric power converter apparatus according to claim 18, further comprising a second layer interposed between the first layer and the first electrode.

20. An electric power converter apparatus according to claim 18, wherein said first conducting type is n-type and said second conducting type is p-type.

* * * * *